(12) United States Patent
Johnson et al.

(10) Patent No.: US 10,423,544 B2
(45) Date of Patent: Sep. 24, 2019

(54) INTERPOSER WITH HIGH BANDWIDTH CONNECTIONS BETWEEN A CENTRAL PROCESSOR AND MEMORY

(71) Applicant: MORGAN / WEISS TECHNOLOGIES INC., Beaverton, OR (US)

(72) Inventors: Morgan Johnson, Portland, OR (US); Frederick G. Weiss, Newberg, OR (US)

(73) Assignee: MORGAN / WEISS TECHNOLOGIES INC., Beaverton, OR (US)

( * ) Notice: Subject to any disclaimer, the term of this patent is extended or adjusted under 35 U.S.C. 154(b) by 0 days.

(21) Appl. No.: 16/288,891

(22) Filed: Feb. 28, 2019

(65) Prior Publication Data

US 2019/0196985 A1    Jun. 27, 2019

Related U.S. Application Data

(63) Continuation of application No. 15/156,211, filed on May 16, 2016, which is a continuation of application
(Continued)

(51) Int. Cl.
*H05K 7/00*  (2006.01)
*G06F 13/16* (2006.01)
(Continued)

(52) U.S. Cl.
CPC .............. *G06F 13/16* (2013.01); *G06F 1/32* (2013.01); *G06F 13/4068* (2013.01); *G11C 5/04* (2013.01);
(Continued)

(58) Field of Classification Search
None
See application file for complete search history.

(56) References Cited

U.S. PATENT DOCUMENTS

| 5,567,654 | A | 10/1996 | Beilstein, Jr. et al. |
| 5,592,730 | A | 1/1997 | Greenstein et al. |

(Continued)

FOREIGN PATENT DOCUMENTS

| JP | 2000353767 | 12/2000 |
| JP | 2006222370 | 8/2006 |

(Continued)

*Primary Examiner* — Courtney L Smith
*Assistant Examiner* — Rashen E Morrison
(74) *Attorney, Agent, or Firm* — Miller Nash Graham & Dunn LLP

(57) ABSTRACT

An apparatus includes a processor having an array of processor interconnects arranged to connect the processor to conductive paths, a circuit substrate having an array of circuit interconnects arranged to provide connections between the processor and the circuit substrate, the circuit substrate having conductive paths connected to the array of circuit interconnects, an interposer substrate arranged between the processor and the circuit substrate, at least one conductive trace in the interposer substrate in connection with at least one processor interconnect in the array of interconnects on the processor, the conductive trace arranged at least partially parallel to the interposer substrate such that no electrical connection exists between the conductive trace in the interposer substrate and a corresponding one of the circuit interconnects on the circuit substrate, and at least one peripheral circuit connected to the at least one conductive trace.

6 Claims, 17 Drawing Sheets

Related U.S. Application Data

No. 14/790,302, filed on Jul. 2, 2015, now Pat. No. 9,357,648, which is a continuation of application No. 13/491,353, filed on Jun. 7, 2012, now Pat. No. 9,086,874, which is a continuation of application No. 13/163,502, filed on Jun. 17, 2011, now Pat. No. 8,363,418.

(60) Provisional application No. 61/476,501, filed on Apr. 18, 2011.

(51) Int. Cl.
| | | |
|---|---|---|
| *G06F 1/32* | (2019.01) | |
| *H05K 1/02* | (2006.01) | |
| *H01L 23/32* | (2006.01) | |
| *H05K 1/11* | (2006.01) | |
| *H05K 1/14* | (2006.01) | |
| *H05K 1/18* | (2006.01) | |
| *H01L 23/498* | (2006.01) | |
| *G06F 13/40* | (2006.01) | |
| *G11C 5/04* | (2006.01) | |

(52) U.S. Cl.
CPC .......... *H01L 23/32* (2013.01); *H01L 23/4985* (2013.01); *H01L 23/49838* (2013.01); *H05K 1/0237* (2013.01); *H05K 1/0243* (2013.01); *H05K 1/0296* (2013.01); *H05K 1/111* (2013.01); *H05K 1/115* (2013.01); *H05K 1/147* (2013.01); *H05K 1/181* (2013.01); *H05K 1/189* (2013.01); *H01L 2924/0002* (2013.01); *H05K 1/141* (2013.01); *H05K 7/00* (2013.01); *H05K 2201/095* (2013.01); *H05K 2201/10159* (2013.01); *H05K 2201/10189* (2013.01); *H05K 2201/10378* (2013.01); *H05K 2201/10515* (2013.01); *H05K 2201/10522* (2013.01); *Y02D 10/151* (2018.01); *Y10T 29/4913* (2015.01)

(56) References Cited

U.S. PATENT DOCUMENTS

| | | | | |
|---|---|---|---|---|
| 5,763,943 | A | 6/1998 | Baker | |
| 5,819,027 | A | 10/1998 | Budelman et al. | |
| 5,854,534 | A | 12/1998 | Budelman et al. | |
| 5,861,666 | A | 1/1999 | Bellaar | |
| 6,102,710 | A | 8/2000 | Beilin et al. | |
| 6,224,396 | B1* | 5/2001 | Chan | H05K 3/325 439/66 |
| 6,246,247 | B1* | 6/2001 | Eldridge | B23K 20/004 257/E21.507 |
| 6,376,769 | B1 | 4/2002 | Chung | |
| 6,429,513 | B1 | 8/2002 | Shermer, IV et al. | |
| 6,463,554 | B1 | 10/2002 | Budelman et al. | |
| 6,779,256 | B2 | 8/2004 | Kappel et al. | |
| 6,982,869 | B2 | 1/2006 | Larson | |
| 7,145,249 | B2 | 12/2006 | Chao et al. | |
| 7,245,507 | B2 | 7/2007 | Dibene, II et al. | |
| 7,596,650 | B1 | 9/2009 | Aditya et al. | |
| 7,609,501 | B2 | 10/2009 | Anthony et al. | |
| 7,855,341 | B2 | 12/2010 | Chambers | |
| 7,915,537 | B1 | 3/2011 | Herbert | |
| 2002/0044423 | A1 | 4/2002 | Primavera et al. | |
| 2002/0053734 | A1* | 5/2002 | Eldridge | B23K 20/004 257/724 |
| 2002/0137252 | A1 | 9/2002 | Larson | |
| 2002/0164838 | A1 | 11/2002 | Moon et al. | |
| 2003/0062614 | A1 | 4/2003 | Larson | |
| 2003/0069654 | A1 | 4/2003 | Larson | |
| 2003/0164548 | A1 | 9/2003 | Lee | |
| 2003/0164551 | A1 | 9/2003 | Lee et al. | |
| 2003/0181075 | A1* | 9/2003 | Hartke | H05K 1/141 439/67 |
| 2003/0229979 | A1 | 12/2003 | Kappel et al. | |
| 2003/0236005 | A1 | 12/2003 | Wu et al. | |
| 2004/0178484 | A1 | 9/2004 | Burdick et al. | |
| 2005/0212112 | A1 | 9/2005 | Chao et al. | |
| 2005/0230795 | A1 | 10/2005 | Furuyama et al. | |
| 2005/0243531 | A1 | 11/2005 | Kulpa et al. | |
| 2006/0049495 | A1 | 3/2006 | Hazeyama et al. | |
| 2006/0057866 | A1 | 3/2006 | Mirsky et al. | |
| 2006/0077644 | A1 | 4/2006 | Nickerson et al. | |
| 2006/0078248 | A1* | 4/2006 | Sasaki | G02B 6/4214 385/14 |
| 2006/0240595 | A1 | 10/2006 | Lee et al. | |
| 2006/0242477 | A1 | 10/2006 | Larson | |
| 2006/0284312 | A1 | 12/2006 | Lee | |
| 2007/0023905 | A1 | 2/2007 | Chao et al. | |
| 2007/0026569 | A1 | 2/2007 | Chao et al. | |
| 2007/0069374 | A1 | 3/2007 | Chen et al. | |
| 2007/0069390 | A1 | 3/2007 | Chen et al. | |
| 2007/0120305 | A1 | 5/2007 | Mandel et al. | |
| 2007/0126111 | A1 | 6/2007 | Mirsky et al. | |
| 2008/0054488 | A1 | 3/2008 | Leddige et al. | |
| 2008/0116559 | A1 | 5/2008 | Hosono et al. | |
| 2008/0148559 | A1 | 6/2008 | Nickerson et al. | |
| 2008/0175008 | A1 | 7/2008 | Hu et al. | |
| 2008/0185733 | A1 | 8/2008 | Furuyama et al. | |
| 2008/0277782 | A1 | 11/2008 | Chen et al. | |
| 2008/0296697 | A1* | 12/2008 | Hsu | H01L 23/5382 257/379 |
| 2008/0309349 | A1 | 12/2008 | Sutono | |
| 2009/0016032 | A1 | 1/2009 | Chow et al. | |
| 2009/0121346 | A1 | 5/2009 | Wachtler | |
| 2009/0161402 | A1 | 6/2009 | Oh et al. | |
| 2009/0173522 | A1 | 7/2009 | Sakamoto et al. | |
| 2009/0197436 | A1 | 8/2009 | Trobough | |
| 2010/0128436 | A1 | 5/2010 | Edmunds et al. | |
| 2010/0133673 | A1 | 6/2010 | Chen et al. | |
| 2010/0134128 | A1* | 6/2010 | Hobbs | G01R 31/2889 324/750.28 |
| 2010/0148335 | A1 | 6/2010 | Mikami et al. | |
| 2010/0252920 | A1 | 10/2010 | Trobough | |
| 2010/0281199 | A1 | 11/2010 | Fu et al. | |
| 2011/0042795 | A1* | 2/2011 | Knickerbocker | H01L 21/486 257/686 |
| 2011/0119425 | A1* | 5/2011 | Kollipara | G06F 13/1668 710/307 |
| 2011/0197438 | A1 | 8/2011 | Kikuchii et al. | |
| 2011/0211310 | A1 | 9/2011 | Farling et al. | |
| 2011/0260781 | A1 | 10/2011 | Takeuchi et al. | |
| 2012/0061853 | A1* | 3/2012 | Su | H01L 21/563 257/778 |
| 2012/0113581 | A1 | 5/2012 | Anguiano-Wehde et al. | |
| 2013/0003310 | A1* | 1/2013 | Raj | H05K 7/1092 361/718 |
| 2013/0258627 | A1* | 10/2013 | Guo | H01L 23/147 361/782 |
| 2016/0259738 | A1* | 9/2016 | Johnson | G06F 1/32 |

FOREIGN PATENT DOCUMENTS

| | | |
|---|---|---|
| JP | 2006310542 | 9/2006 |
| JP | 2006320542 | 9/2006 |
| WO | 2009084299 | 7/2009 |

\* cited by examiner

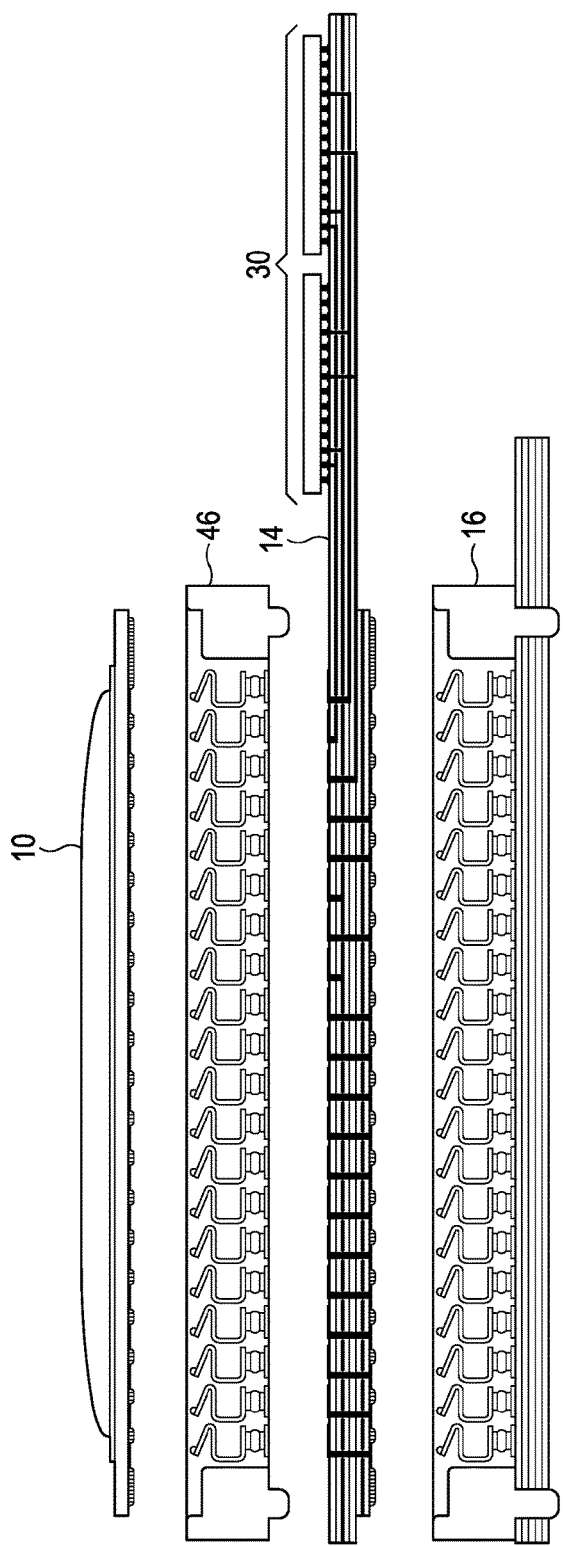
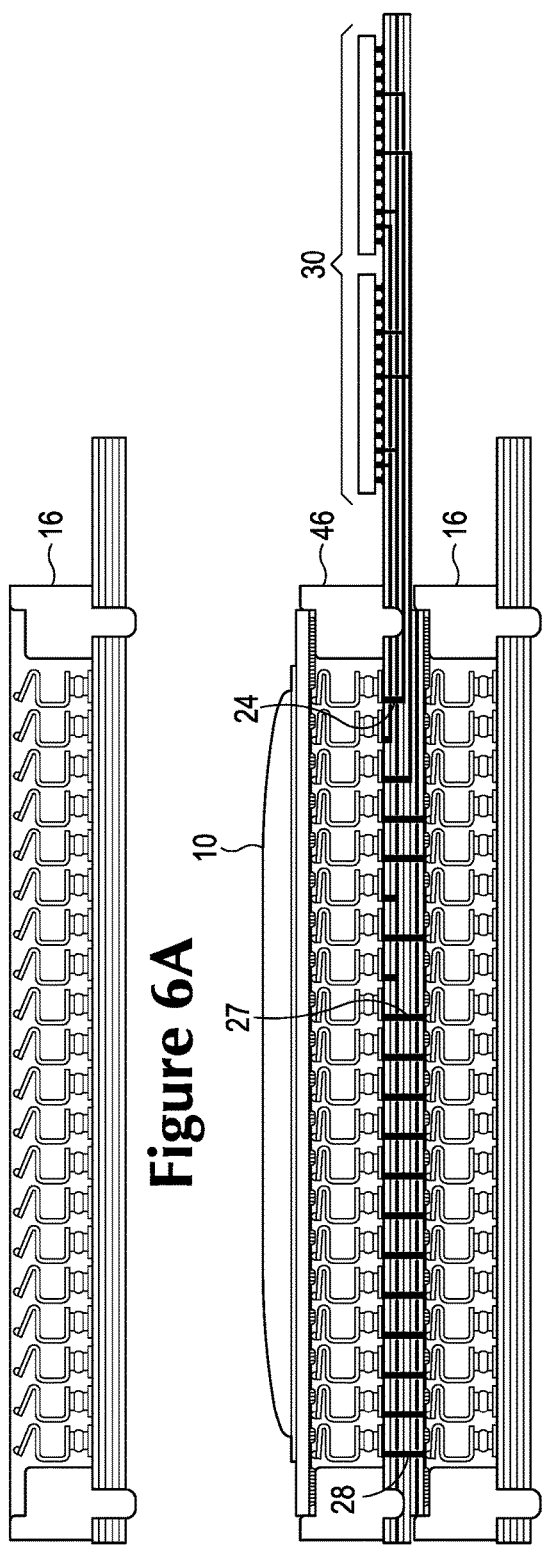
Figure 6A
Figure 6B

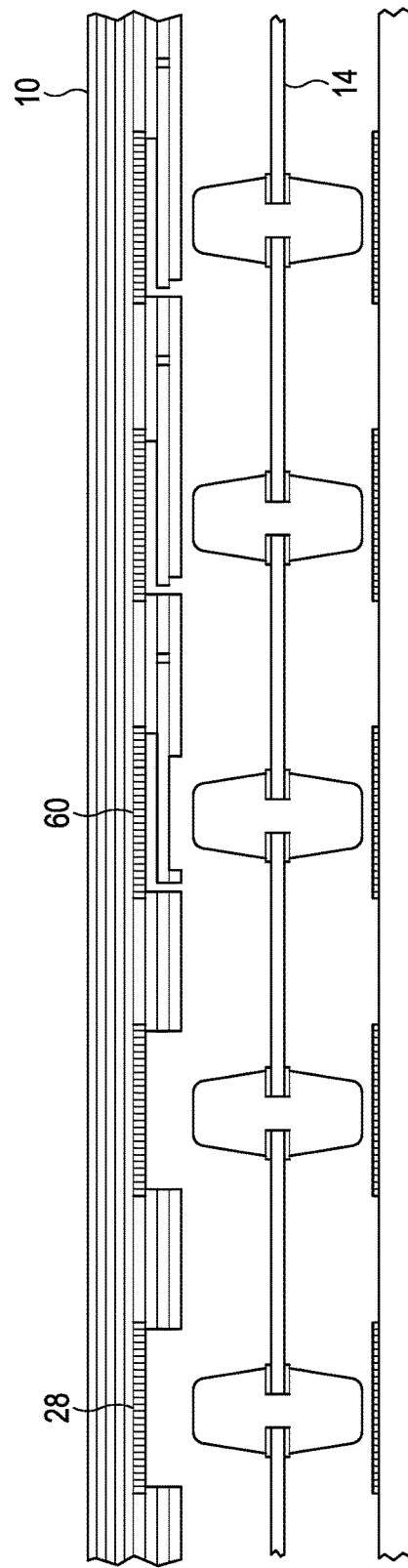
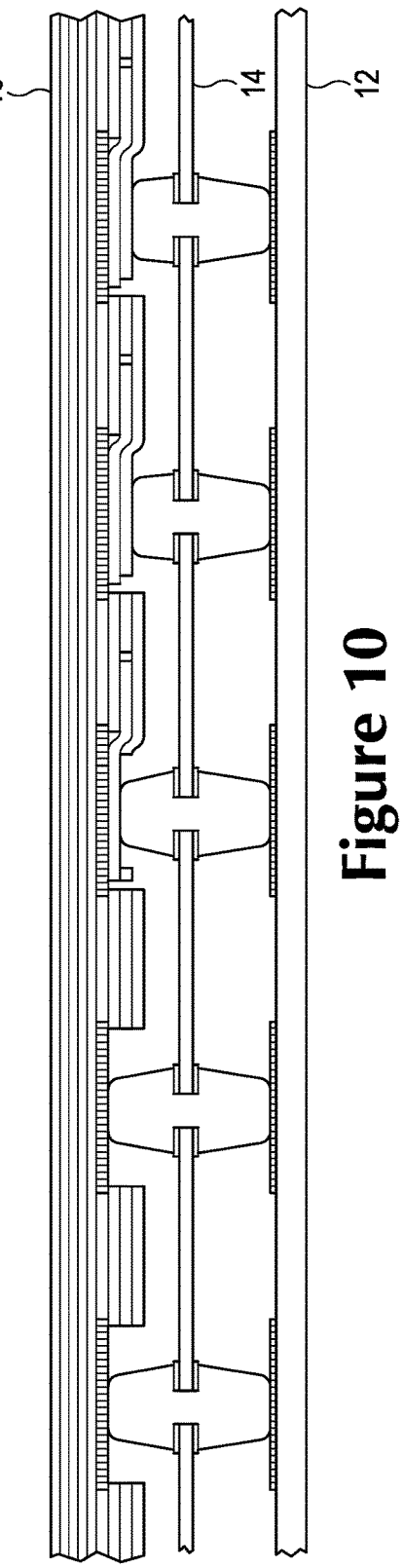
Figure 9
Figure 10

INTERPOSER WITH HIGH BANDWIDTH CONNECTIONS BETWEEN A CENTRAL PROCESSOR AND MEMORY

This application is a continuation of, and claims priority to, U.S. patent application Ser. No. 15/156,211 filed May 16, 2016, which is a continuation of U.S. patent application Ser. No. 14/790,302, filed Jul. 2, 2015, now U.S. Pat. No. 9,357,648 issued May 31, 2016, which is a continuation of U.S. patent application Ser. No. 13/491,353, filed Jun. 7, 2012, now U.S. Pat. No. 9,086,874, issued Jul. 21, 2015, which is a continuation of U.S. patent application Ser. No. 13/163,502, filed Jun. 17, 2011, now U.S. Pat. No. 8,363,418, issued on Jan. 29, 2013, which claims the benefit of U.S. Provisional Application No. 61/476,501, filed Apr. 18, 2011, which are incorporated herein in their entirety.

BACKGROUND

Central processing units in all different types of computing devices continue to increase in operating speed, with similar gains occurring in peripheral circuits such as memories, peripheral computing interface (PCI) circuits, graphics processors, and many others. However, the gains in speed have begun to run into external physical limitations that hamper performance by capping the data transfer speed between the processor and its associated peripheral devices, including the memory. These limitations include signal integrity problems due to high capacitance/high resistance signal lines, tight line spacing on printed circuit boards which leads to crosstalk, connector and circuit trace discontinuities in the signal path, and increased power consumption leading to higher device temperatures and heat management problems. Dealing with these factors often results in lengthened, more expensive design cycles, more costly motherboard layout and production, and more complicated and costly cooling techniques.

One can view signal integrity as the measure of confidence that a data value received at one end of a signal line matches the data value transmitted from the other end. As the transmission speed increases, previously inconsequential circuit non-idealities such as cross-talk, line capacitance, and impedance discontinuities, have a greater impact on the signal fidelity, which limits the achievable speed to a level below that what the native semiconductor devices could otherwise support.

The number of elements within CPU and memory devices, and their native switching speed, has increased along the way to increasing processing speed, and the number of Input-Output (I/O) pins has similarly increased to provide wider data paths and, hence, transfer rate, to the outside world; however, the general package size remains the same or smaller. This results in more and more dense CPU connector pin arrays, which in turn forces the signal lines between external devices and the CPU to be placed closer and closer together. This leads to increased line-to-line coupling, resulting in greater cross-talk and reduced signal integrity.

Other characteristics associated with current architectures also contribute to reduced signal integrity. The push to increase memory capacity results in more and more memory devices being connected to the memory bus, often resulting in longer bus lengths to accommodate more memory modules. Longer lines, however, come at a price, which includes relatively high capacitance in the signal paths, relatively high series resistance of the signal paths, an increasing number of discontinuities in the signal path, and greater disparity in time delays between the driving end of the bus and the nearest and farthest load or destination devices.

In a typical memory array, precise synchronization of send and receive activities is vital to the proper overall operation. As more and more memory or other peripheral circuits or devices are connected along a bus, the disparity in the time delay between the CPU and the nearest destination or load device, and the CPU and the farthest destination or load device, becomes problematic. For proper synchronization, all devices must wait until certain signals have been received, thus limiting the speed of the entire network to that of the slowest (farthest away) device. Various techniques are used to attempt to mitigate this so-called differential delay problem, but in general, the longer the line the slower the overall performance.

The signal lines between the CPU and memory or other peripherals may be crafted as transmission lines having a specific line impedance, with driving and load end terminations, or as simple wires. Transmission lines generally provide the highest speed signal transmission environment, but the requirement that they be resistively terminated for proper signal integrity mandates the use of extra power supplies and termination resistors, and an attendant increase in power. If properly terminated an ideal transmission line can provide good signal fidelity independent of length; however, in the case of a memory system, each connection, or "Tap", along the line, and the series resistance inherent in the wire itself, disrupt or attenuate the signal along the line and place a limit on the useful length at any given frequency of operation.

Signal lines may also be designed as simple wires, in which case they do not require termination; however, their performance is now limited by the series resistance of the metal, and the parasitic capacitance to ground and/or other nearby wires.

The series resistance in each signal line consumes a portion of the signal power present at the input end of the line, converting the electrical energy into heat and in the process attenuating the signal. The longer the line the greater the signal attenuation, until at some point the receiving end can no longer recognize the information encoded on the signal. This imposes limits on the length of the signal path, which will probably be different than in the case of a transmission line environment described above and, therefore, the overall size of the memory. Amplifiers, buffers, and repeaters may alleviate this issue, but these all contribute to increased overall component count and board area, increased power and thermal load, and increased cost and complexity of the system.

Signal lines crafted as simple wires are also sensitive to, and limited by, their capacitance to ground and surrounding conductors. As the length of the line increases, or the physical distance to ground or other conductors is reduced, or the number of taps increases, the line capacitance increases. Higher capacitance, coupled with higher resistance, results in lower signal path bandwidth, which in the case of a digital pulse train slows the rising and falling edges. As the edges slow the pulse stretches out in time, so fewer bits of data can be transmitted in a given interval and data transfer rate drops or become limited. As the pulse transmission rate is increased the data bits can run together resulting in errors due to so-called inter-symbol interference.

Discontinuities typically consist of transitions in the size and thickness of the metal or other conductive material forming the signal path. For example, a signal line transition to the contact pad of a through-via on a printed circuit board, a trace turning a corner, a signal line intersecting the contact pad for a memory connector, or for a pin on the ball grid array or land grid array on an integrated circuit, all cause discontinuities. These change the local impedance of a transmission line on the one hand, or add capacitance to a simple wire on the other hand, both of which distort the shape of the signal due to reflections or simply reduce the bandwidth and, hence, the amplitude. All of these effects impact the signal integrity, in turn leading to data errors that require compensation such as periodic retransmission of the signals, confirmation signaling, or other typical error correction approached.

One approach to handling signal integrity problems involves boosting the power of the signal to compensate for attenuation or distortion, resulting in higher power consumption for the CPU and the peripheral circuits. This also produces a higher level of heat to manage. Heat in general causes a degradation in the semiconductor devices due to increased current leakage within the transistors, as well as a general reduction in transistor operating speed due to decreased conductor mobility. This mitigation approach can result in a cycle of boosting the power to overcome the loss of speed, generating more heat because of the increased power, which then requires a further increase in power and heat, until one reaches a practical or economic limit.

Other error mitigation approaches involve reducing the speed of the transmissions, thereby reducing the impact of capacitive loading on the lines, as well as reducing the power required to drive the lines at higher speeds. However, this approach runs counter to the desire for faster speeds and more performance.

Still other mitigation approaches stack the memory chips and/or the processor chips to shorten the communication paths. However, these require custom designed motherboards and non-traditional system architectures, making them impractical for typically uses.

BRIEF DESCRIPTION OF THE DRAWINGS

FIGS. 6A and 6B shows an embodiment of an alternative packaging arrangement.

FIGS. 9 and 10 show side views of an embodiment of an interposer having elastomer contacts.

DETAILED DESCRIPTION OF THE EMBODIMENTS

Figure 1:
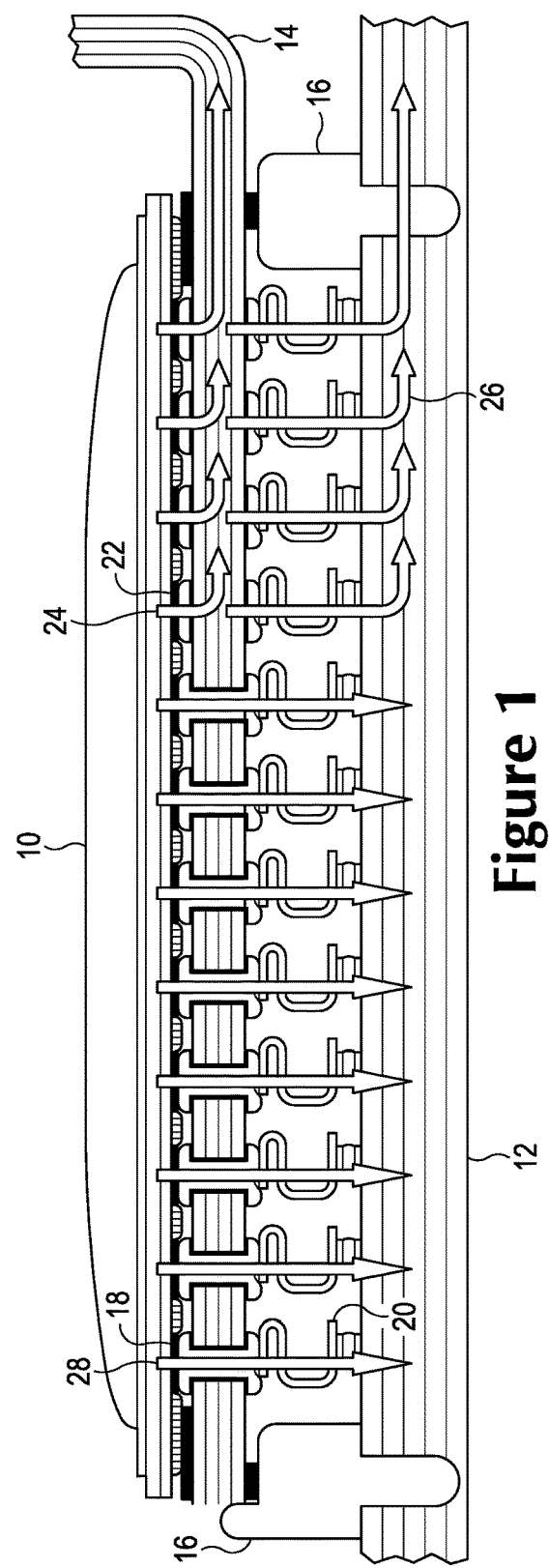
FIG. 1 shows an embodiment of an above motherboard interposer.

FIG. 1 shows an embodiment of an "above motherboard" or "above board" interposer. The term "above motherboard" refers to the location of the interposer as being up above the socket or mounting plane for the central processing unit. The term "central processing unit" may be the main processor for a computing device or may be the processor on any kind of accessory board, such as a video or audio board, although the term may be referred to as a CPU. The term "above motherboard" also refers to the configurations of the connections between the processing unit and peripheral circuits. The peripheral circuits here are those that reside upon the above board interposer, to which the connections are made through the interposer, rather than through the motherboard. While several examples are given below, the peripheral circuits may be any type of integrated circuit and no limitation to any particular type is implied.

FIG. 1 shows a CPU package 10 mounted to a motherboard 12 through a connector 16. In this instance the connector consists of a land grid array (LGA) using springs such as 20 to make connections between the array of connections on the CPU package and the array of connectors such as 18 and 22 on the motherboard to which the processor will connect. While in this embodiment the connectors are LGA connections, but may also consist of a ball grid array (BGA), a pin grid array (PGA), elastomer contacts, etc., for either the connector between the CPU and the above board interposer or between the above board interposer and the motherboard. For purposes of this discussion, any mechanisms that connect between the motherboard, the interposer, and the CPU package will be referred to as interconnects, whether they bill pads, BGAs, PGAs, LGAs, etc.

In prior art, all of the connections between the processor and the motherboard would pass through the socket to the motherboard, such as 26. With the use of the above board interposer 14, selected ones of the connections between the CPU 10 and traces on the motherboard 12 become rerouted through the interposer to the peripheral circuits on the interposer, not shown here. The route 24 shows an example of one of the rerouted paths. As will become apparent in further discussion, this reduces the connection length, the number of discontinuities, and eliminates many issues with routing the connections through the motherboard.

In some instances, some connections between the CPU and the motherboard remain untouched in their routing. For example, connection path 28 between the connector 18 and the motherboard 12 will pass through. On the other hand, the connection between connector 22 and the motherboard has been rerouted to pass through the interposer 14, and will not make connection to the motherboard.

Figure 2:
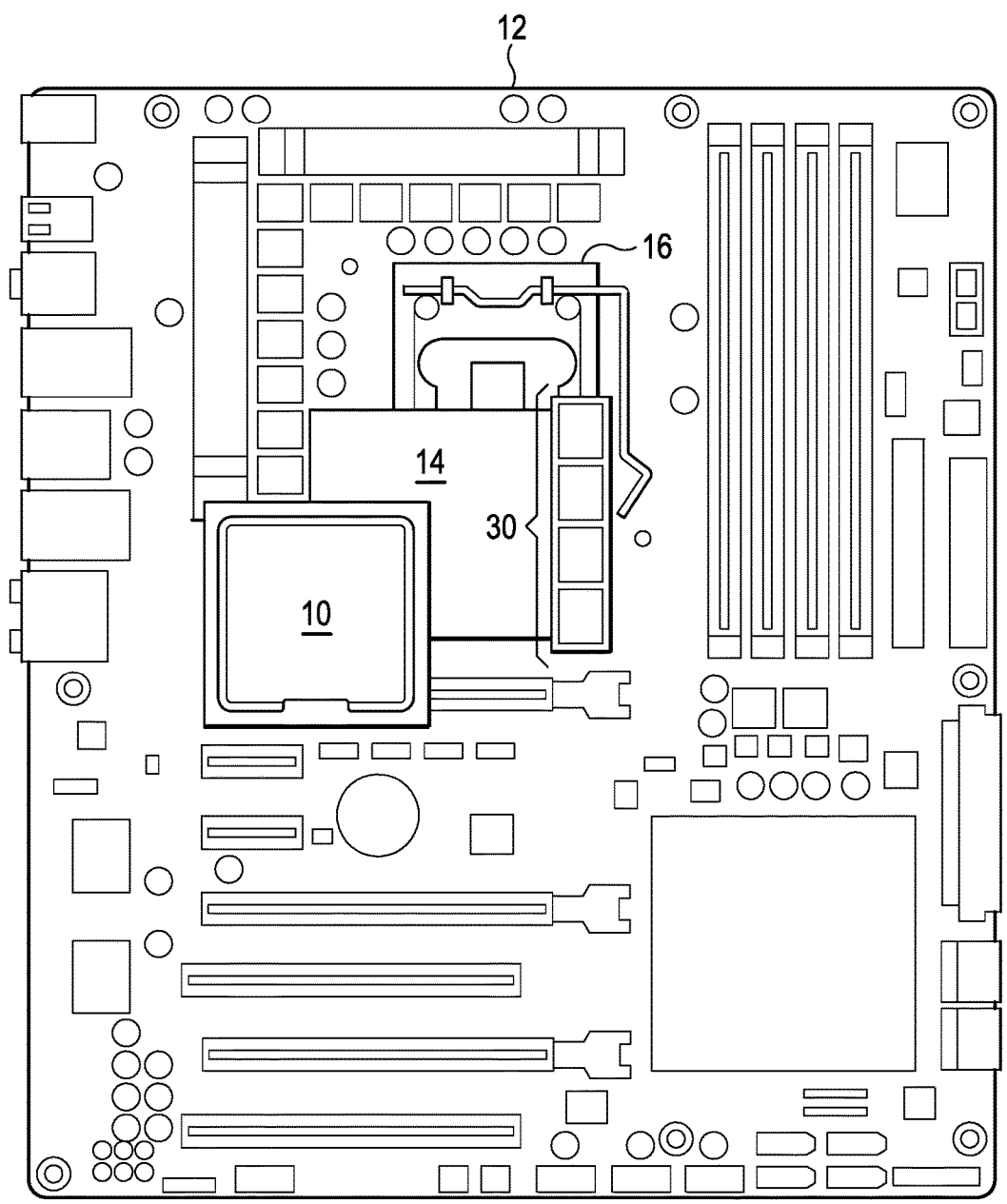
FIG. 2 shows a plan view of an embodiment of an above motherboard interposer.
Figure 3:
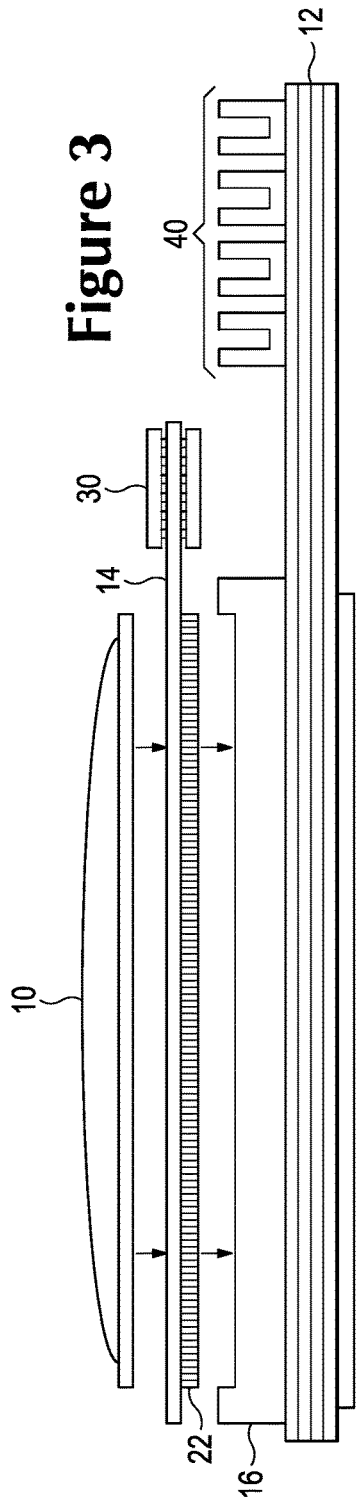
FIG. 3 shows an embodiment of a motherboard having a connector.
Figure 4:
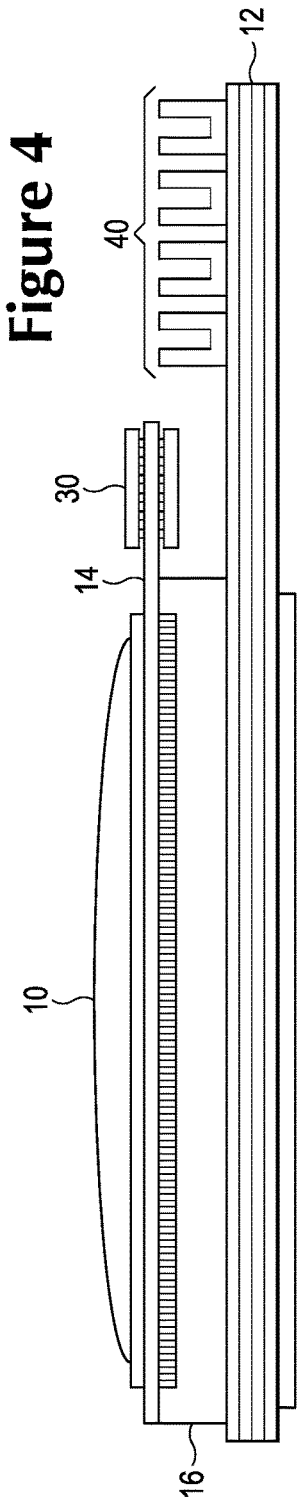
FIG. 4 shows an embodiment of a CPU mounted into the connector with an interposer.
Figure 5:
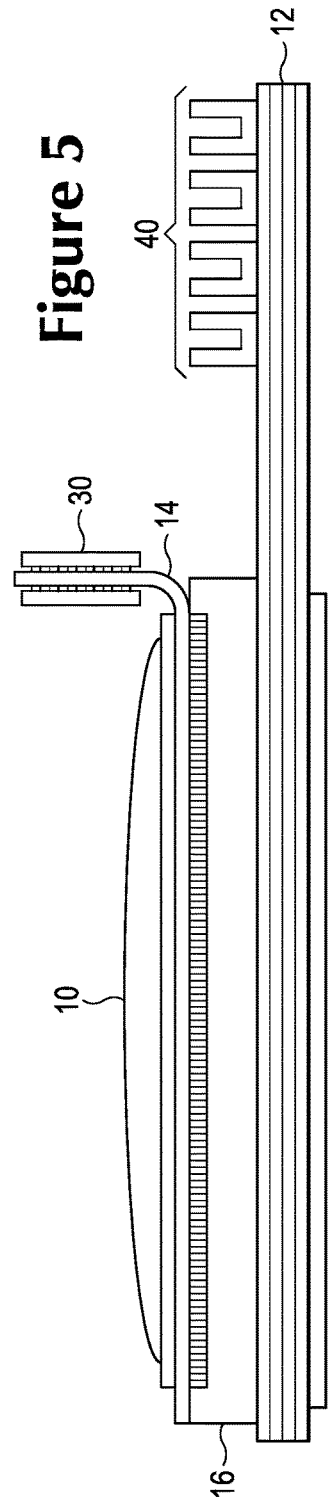
FIG. 5 shows an embodiment of a flexible interposer.

FIG. 2 shows a plan view of the same configuration. Motherboard 12 has a connector 16 that may consist of a LGA, BGA, etc., forming an array of connections to which the CPU 10 will connect to the motherboard 12. The above board interposer 14 lies between the CPU 10 and the connector 16. The above board interposer 14 includes peripheral circuits 30. Peripheral circuits may comprise memory, PCIe circuits, solid state disk drives, etc. FIGS. 3-5 show a side view of an embodiment of the above board interposer.

FIG. 3 shows the motherboard 12 upon which resides the connector 16. In this embodiment, the peripheral circuits 30 comprise at least one memory circuit. In the prior art, the memory utilized by the CPU 10 would typically reside somewhere on the motherboard 12, such as in the dual inline memory module (DIMM) connectors 40. By moving the memory onto the above board interposer 14, one can significantly reduce access times, signal path length, discontinuities, capacitive and resistive effects, as well as increasing the signal integrity.

In FIG. 4, the CPU has been mounted into the connector 16 with the interposer 14 in place. In FIG. 5, one can see that the interposer is flexible, allowing the portion or portions of the interposer to fold up perpendicular to the connector. This allows the interposer to be used with any socketed or otherwise insertable processor without impacting the current architecture on the motherboard.

FIGS. 6A and 6B show an alternative packaging arrangement in which there is a LGA/spring connection 16 between the motherboard 12 and the interposer 14, as well as the connector 46 between the interposer and the CPU package 10. FIG. 6A shows the CPU, the interposer, the sockets 16 and 46 as separate components. FIG. 6B shows the components assembled together. The resulting structure has pass through connections such as 28, "T" connections such as 27, and rerouted connections such as 24. In this embodiment, the peripheral circuits 30 reside on one side of the interposer.

Figures 7A, 7B:
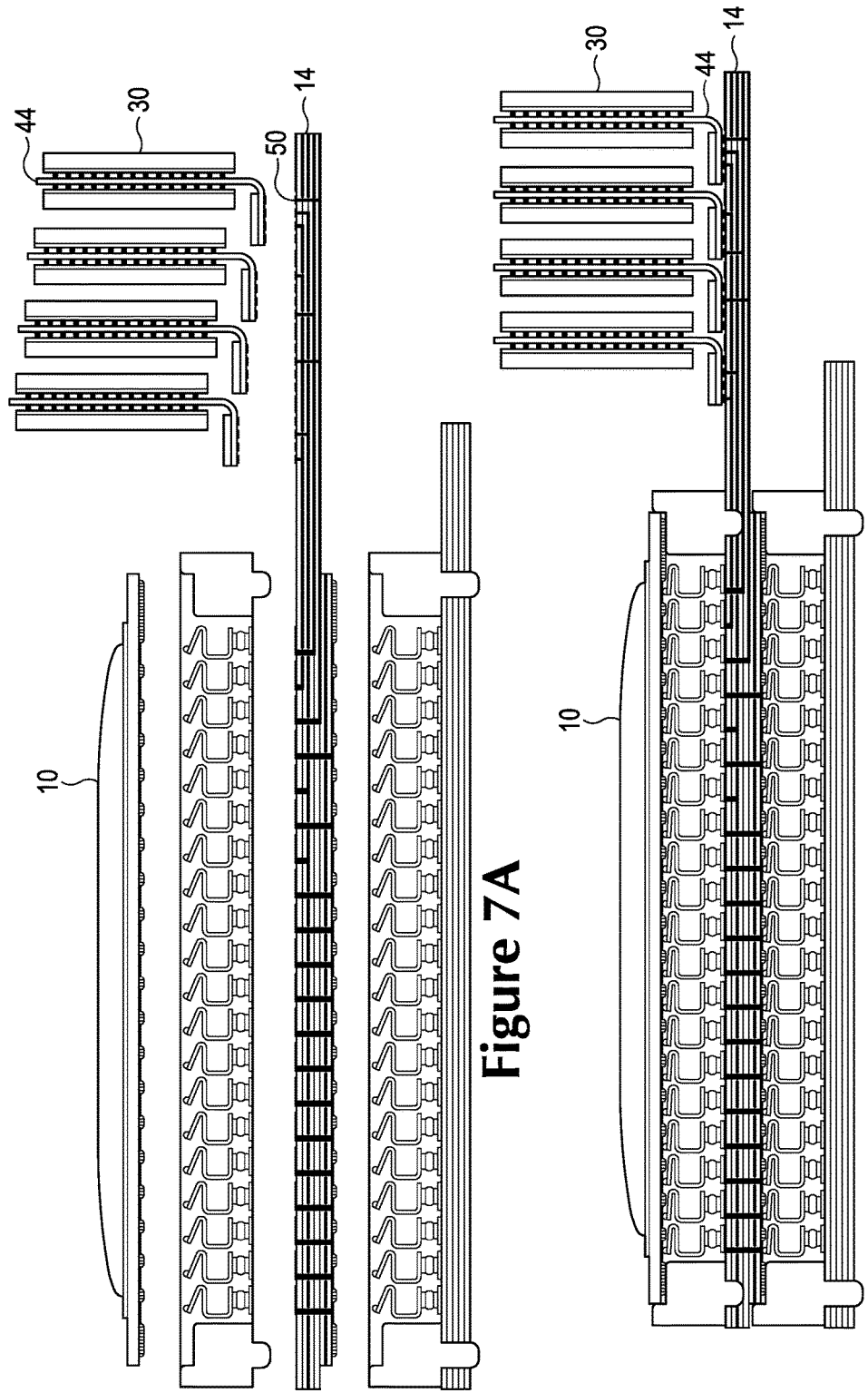
FIGS. 7A and 7B show an alternative embodiment of an alternative packaging arrangement.

FIGS. 7A and 7B show a similar arrangement as FIGS. 6A and 6B, except that the interposer has connectors 50. The peripheral circuits 30 in this embodiment are attached to auxiliary interposer substrates such as 44. The auxiliary interposer substrates connect to the above board interposer 14 connects through connectors 50. These connectors such as 50 may be populated or not, as desired. This configuration allows highly flexible arrangements of peripheral circuits in close proximity with the CPU. Further, the auxiliary interposers may also be flexible to allow them to be bent to accommodate a particular architecture, or may be pre-bent or flexed to allow their arrangement.

Figure 8:
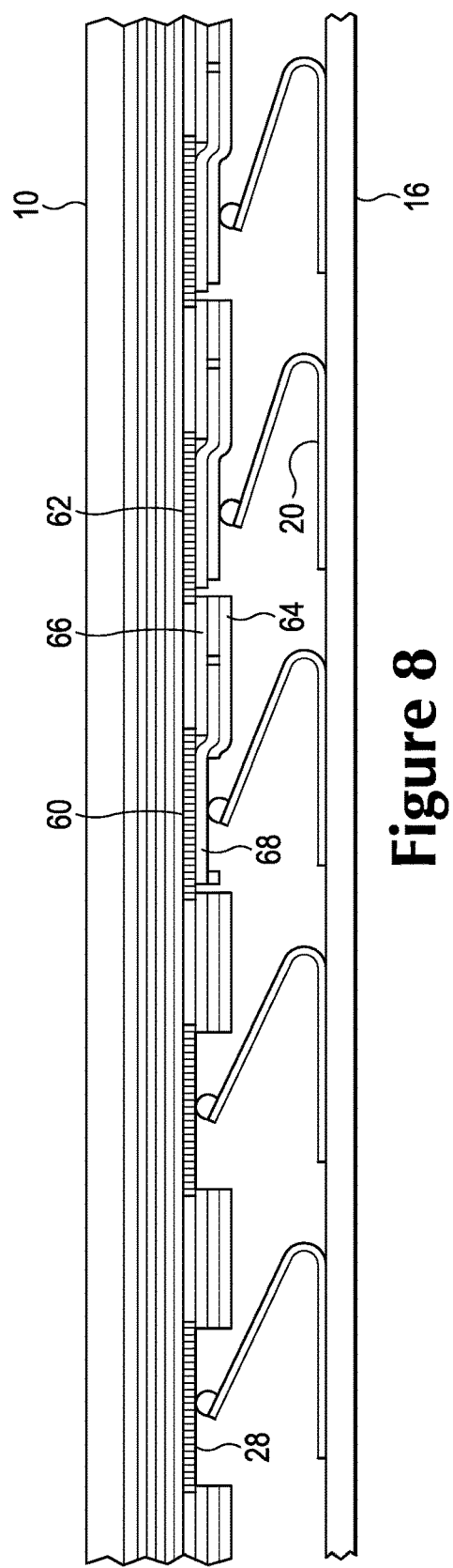
FIG. 8 shows a side view of an embodiment of an interposer with spring contacts.

FIG. 8 shows a side view of the interposer in contact with spring contacts. Again the connection can consist of spring contacts such as in an LGA connector, or other types of connectors, as mentioned previously. A possible point of confusion may result from the above board interposer being confused with what is typically referred to as a test interposer. Test interposers are typically employed to allow a device to be tested without damaging the device, and typically do not remain in place during normal operation; most importantly, however, test interposers are not required for proper operation of the device, in contrast to the above board interposer which is a key, required, functional element of the system.

Test interposers typically have one of two types of connections, a T-type connection or an 'out-and-back' connection. In a T-connection, a pass-through connection may have a further branch off of the side of it, similar to the letter T. An out-and-back connection has a connection that goes out from the connector on the CPU and then back to the same connector. It should be noted, that in contrast to the above board interposer, the connection either passes through or gets rerouted through the interposer, typically not both, although the T connections could be used as well. FIG. 8 shows this in comparison.

At least three layers exist in the interposer, a layer of nonconductive material 64, such as polyimide or FR-4, a layer of metal used to make connections in the above board interposer, and a solder mask 66 used to insulate the metal layer 68 from unwanted contact with other devices or features, and define access points to the metal layer 68 at locations at which connections to other devices or features will be formed. For pass through contacts, such as 28, none of these three layers are involved. For a connection that mimics a test interposer T connection, such as 68, the metal layer 68 is involved. For a rerouted connection such as that from contact pad 62, the polymer or other nonconductive material 64 ensures that the connection from pad 62 does not reach the motherboard. Instead, the metal layer 68 will route that connection through the interposer to the peripheral circuits, not shown.

FIGS. 9 and 10 show a side view of another embodiment of an interposer substrate, using elastomer connections such as TYCO MPI (metalized particle interconnect) conductive elastomer bumps. The use of flexible connectors or contact media in the arrays of connectors may assist with mechanical conformity and connection integrity.

Using the interposer, with whichever kinds of connectors or contacts are used, reduces many of the issues with memory connectors on motherboards, such as DIMMs. It must be noted that while the discussions may use DIMMs as an example of memory connectors, the same reasoning applies to any on-motherboard memory or peripheral circuit connectors. One such issue with on-motherboard connectors such as DIMMs is the fanout length of the signal paths.

Figure 11:
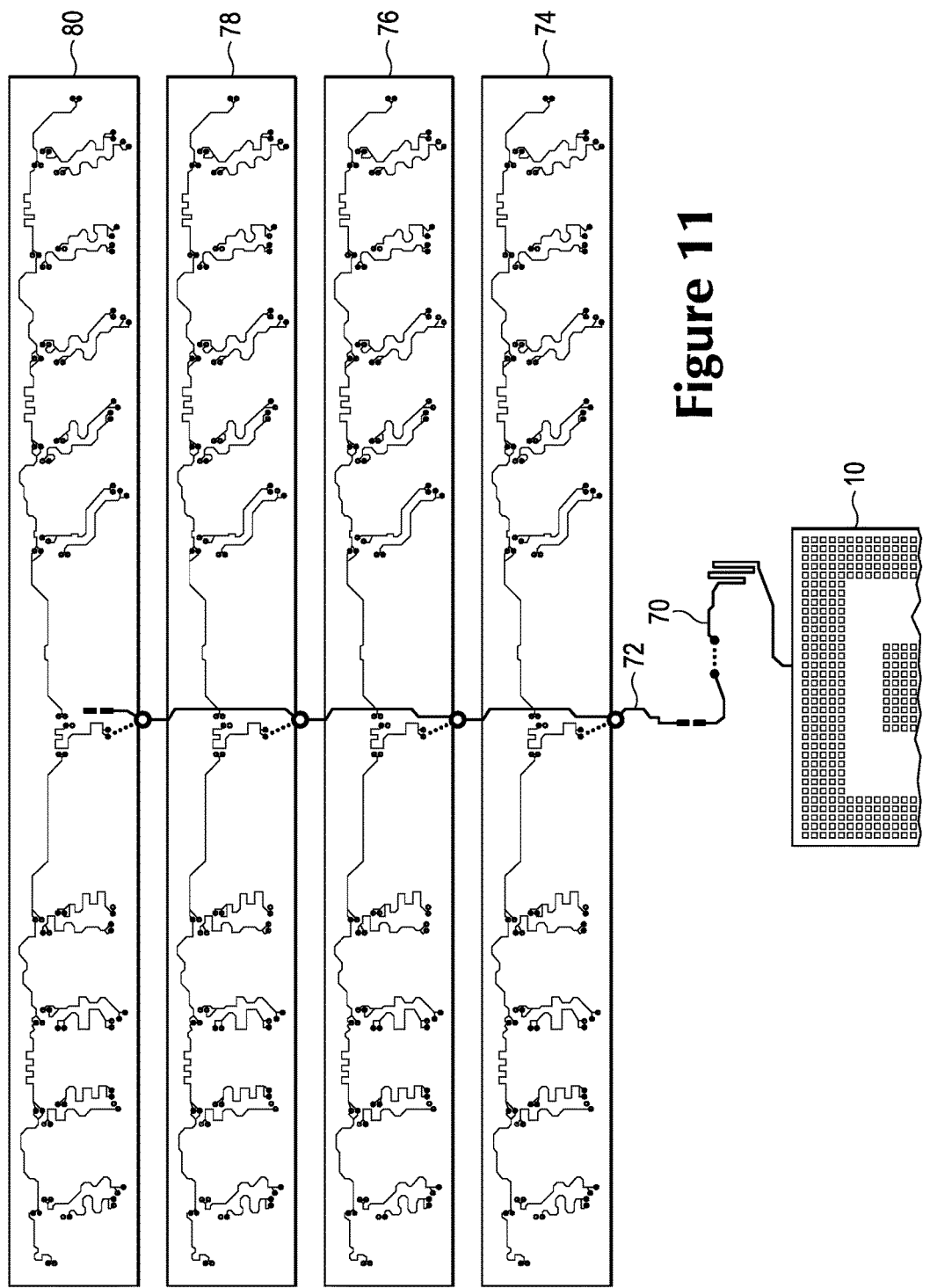
FIG. 11 shows a prior art fanout length of DIMM connectors on a motherboard.

The length of the signal path has a huge effect on the signal integrity of signals traveling the path. Resistive and capacitive effects, as well as discontinuities, reduce the power of the signal and can cause errors when received if the signal does not 'make it' to the other end with the correct voltage. FIG. 11 shows a prior art fanout length of DIMM connectors on a motherboard, a single-line, multi-drop, fanout with four memory modules.

Figure 12:
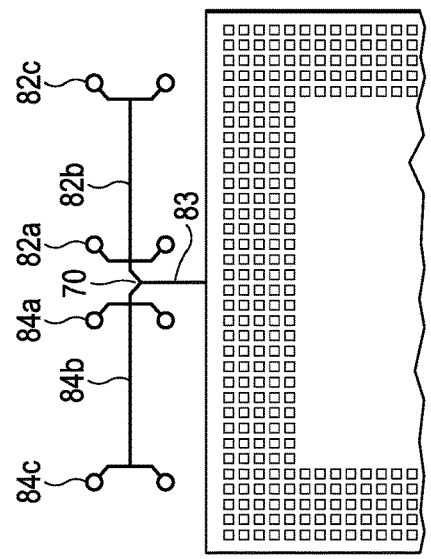
FIG. 12 shows a fanout length of an above board interposer.

The CPU 10 connects to a line 70 which in turn connects to a line 72. Line 72 traverses the four DIMM connectors, each of which represent one drop off of the line. The fanout length for four DIMMs is approximately 52 inches, for six DIMMs it is approximately 80 inches. In contrast, as shown in FIG. 12, the fanout length for the above board interposer to a memory module example is between 1.5 to 2.5 inches from the CPU 10 through the on-board connector 70 through the paths 82a-c or 84a-c. These segments will be discussed further with regard to FIGS. 14 and 15.

Further, the above board interposer has a path length that is within a quarter wavelength of the signals that will traverse the path. The advantages of being within a quarter wavelength include no need for transmission lines, which saves power; a simpler signal path; lower capacitive load requiring smaller drive signals, saving power; lower read/write latency; simpler wire layout; lower part counts without the need for terminating resistors, capacitors, etc.; smaller printed circuit board (PCB) footprint with fewer layers, making it less expensive; and enhanced reliability with fewer vias and solder joints.

Typically, to determine the ¼ wavelength, one divides 300 by the clock frequency of the signal, producing the wavelength of the signal in meters. For a clock frequency of 1.066 GHz, one would divide 300 by 1066 MHz, resulting in 0.281 meters, or 281 millimeters, or about 11 inches. One quarter of 11 inches is approximately 2.73 inches or 70 millimeters. Therefore, using the above board interposer provides the above advantages.

Figure 13:
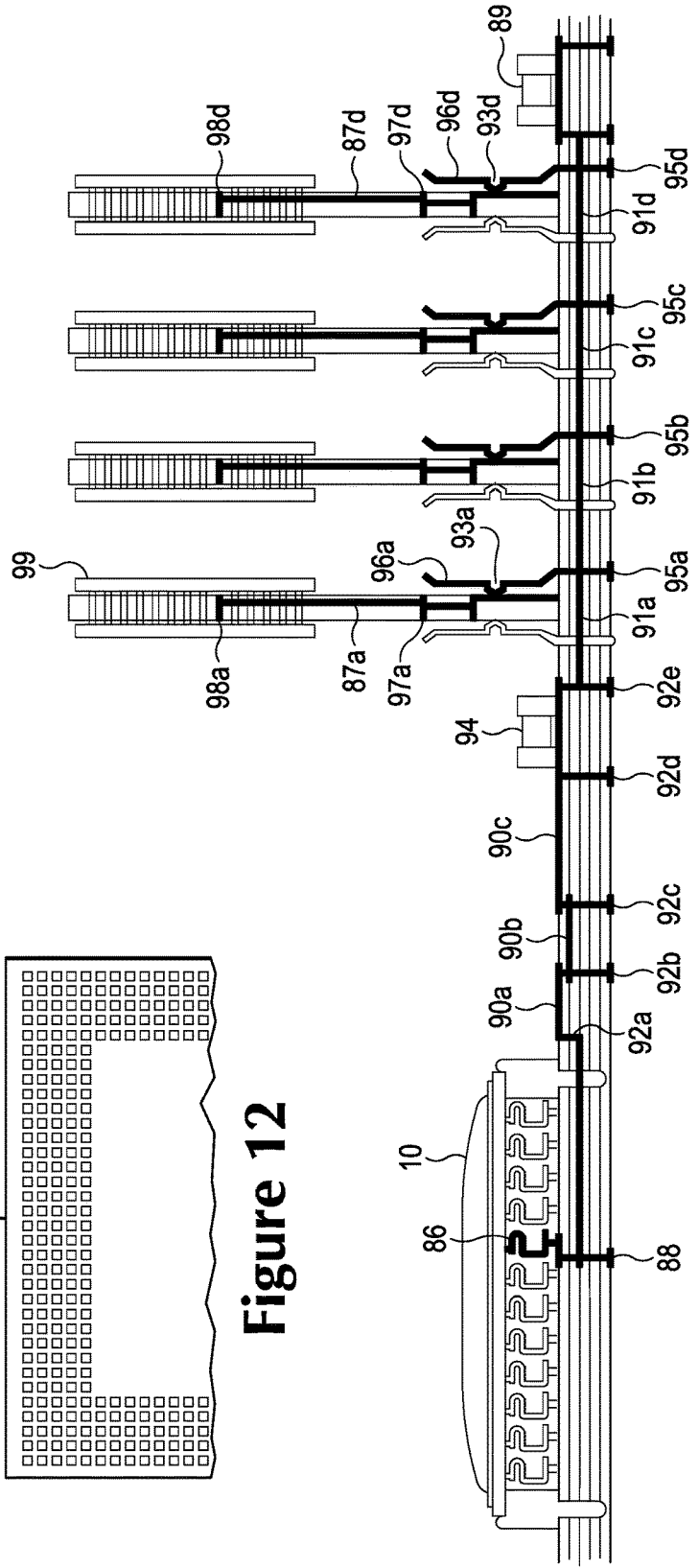
FIG. 13 shows a prior art embodiment of a signal path having multiple different discontinuities.

Further, the use of the interposer eliminates many of the signal discontinuities that exist in current architectures where the processor interacts with peripheral circuits through the motherboard. FIG. 13 shows a prior art example of a signal path having multiple different discontinuities. The path provides the connection between the CPU 10 and one of the DIMM connectors such as 99.

The path of FIG. 13 includes multiple discontinuities of several different types. The CPU connects to the motherboard through the spring 86 introducing a first, inductive, discontinuity, followed by inductive discontinuities 93a-d at the memory module sockets, among others. Capacitive discontinuities include through-hole via stubs such as 88, 92a-e and 95a-d. Potential wire impedance mismatches occur throughout the signal path, at locations such as 90a-c and 91a-d, within the circuitry of the memory modules, and at resistor 94 on the motherboard.

Once the path reaches the connectors for the modules, further through-hole via stubs 95a-d exist in the motherboard, on the way to additional inductive discontinuities due to the contact metal in the plug-in connectors 93a-d. In the modules themselves, capacitive discontinuities occur at the edge connector contact pads 96a-d, and further through-hole via stubs 97a-d and 98a-d. All of these discontinuities, whether capacitive, inductive, or resistive, result in impedance mismatches and have negative effects on the signal integrity. In contrast, referring back to FIG. 12, there are very few signal discontinuities in the signal paths of the above board interposer substrate.

Time Domain Reflectometry ("TDR") is a standard measurement method used to characterize the quality of a high speed signal path, which method provides insight into both the magnitude and physical location of discontinuities in a signal path. The method operates by sending a fast-rising step waveform down a signal path, and displaying the resulting reflections on an oscilloscope screen. The time (X−) axis relates to the physical location along the path, and the amplitude (Y−) axis displays the impedance at each point along the line, measured in ohms.

Figure 14:
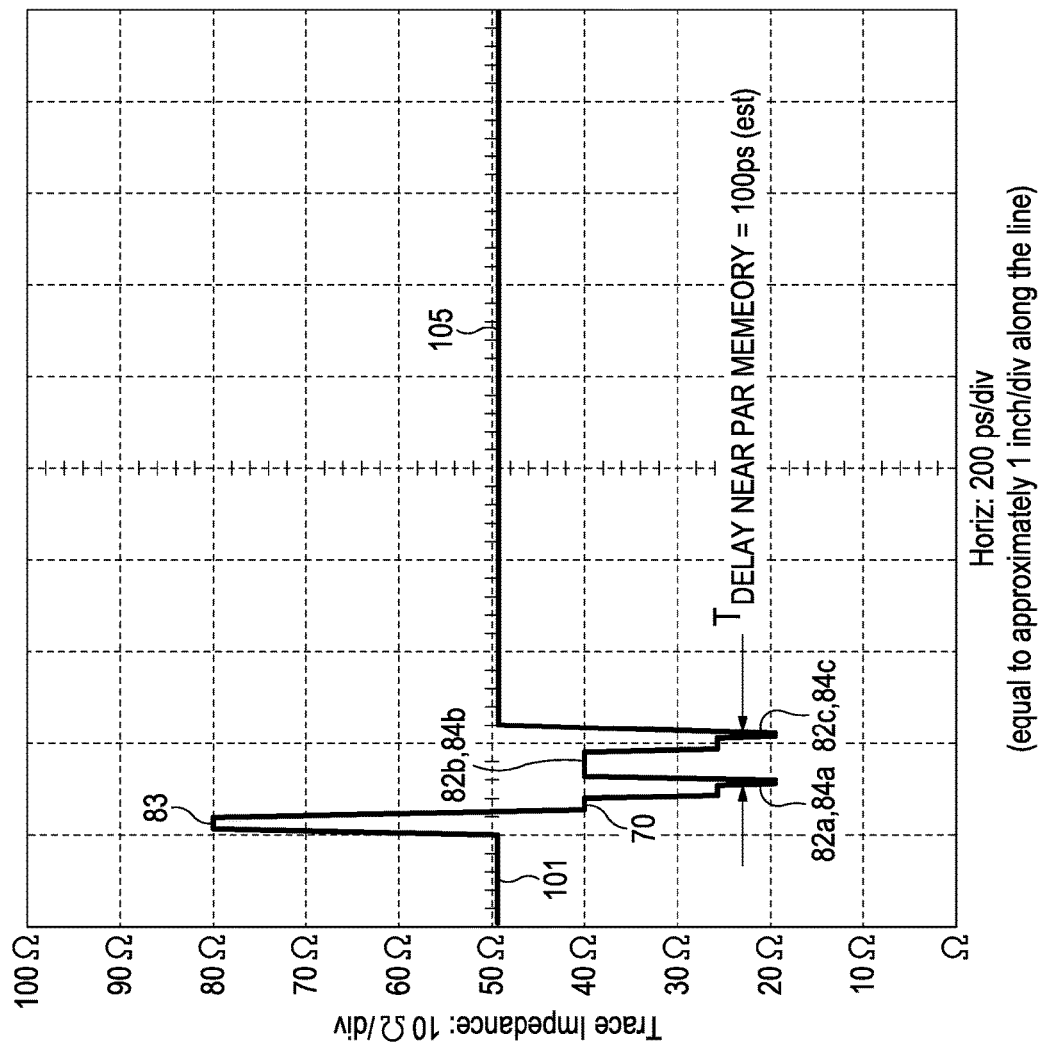
FIG. 14 shows the TDR response of an embodiment of an above board interposer signal line.

The image of FIG. 14 shows the TDR response of the above board interposer signal line of FIG. 12, viewed looking into the line from the end that would contact the CPU pin. In a typical measurement setup, the line under test would be connected to the TDR instrument using a length of 50 ohm transmission line 101 which measures as 50 ohms. Ideally, the entire signal path from CPU to memory IC would be 50 ohms, under which conditions there would be no signal degradation due to discontinuities.

When the signal encounters the line 83 between the CPU pin and the point 70 at which it begins to fan out to the memory elements, one sees that the typically very narrow line 83 needed to escape from the dense array of CPU pins exhibits an impedance of 80 ohms. When the signal reaches junction point 70, it encounters the beginning of 84b, an 80 ohm line to the left, and 82b, an 80 ohm line to the right; together the two present an impedance of 80/2=40 ohms, as shown in FIG. 14. Very shortly after passing point 70, lines 82b and 84b branch again into lines 82a and 84a, which cause the impedance to drop to 80/3=27 ohms.

The 40 ohm impedance level lasts only as long as it takes the signal to travel to the ends of stubs 82a and 84a, where it encounters a further drop to 20 ohms as a result of the signal encountering the pin capacitance of the memory ICs located at the ends of stubs 82a and 84a. After the pulse edge passes the junction points of 82a-82b, and 84a-84b, the impedance returns to the 82b, 84b level of 40 ohms until it reaches the junctions with paths 82c and 84c, where a process holds sway that is similar to that at the junctions with 82a and 84a. The time delay between the arrival of the signal at the first memory IC, and the ends of stubs 82a and 84a, and its arrival at the memory ICs at the ends of stubs 82c and 84c, ultimately plays a role in determining the maximum operating speed of the system: Since all devices must see stable "1" or "0" signal levels, the system has to wait at least as long as the approximately 100 ps required for the signal to traverse the distance between the closest and farthest memory ICs.

Figure 15:
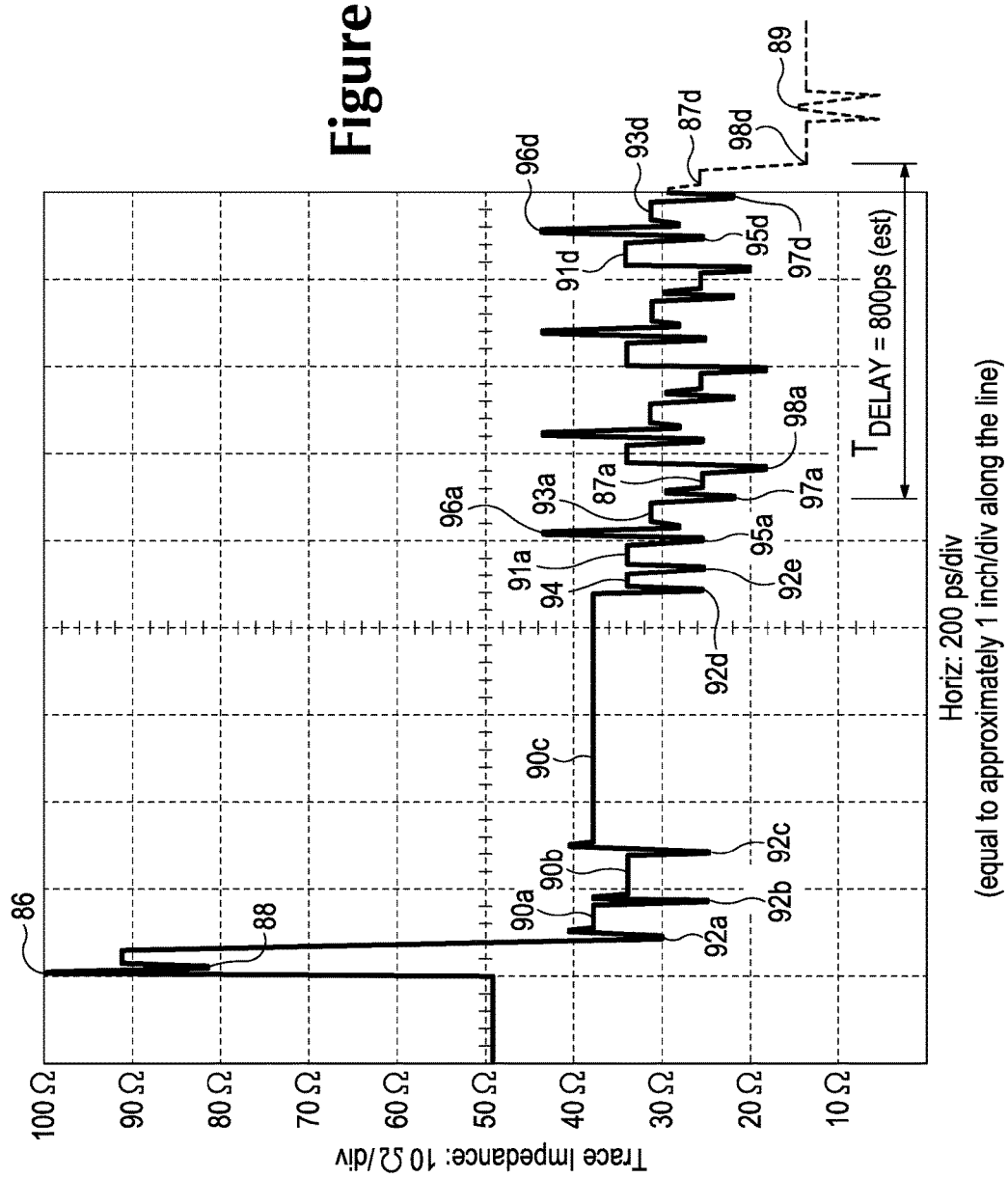
FIG. 15 displays a TDR signature of the signal path of a conventional motherboard to memory module path.

FIG. 15 displays the TDR signature of the signal path of FIG. 13, namely that of a conventional motherboard-memory module. In like fashion to FIG. 14, the TDR signal is launched from a 50 ohm coax, 103. Unlike the case with the above board interposer, the signal first encounters the spring of the CPU socket, 88, and a via in the motherboard, 86, which introduce inductive and capacitive discontinuities, respectively. The signal then traverses a length of narrow line, 85, similar to 83 in FIG. 12 and used for the same purpose, namely to escape from the dense array of pins beneath the CPU socket. Because line 85 is narrow, its impedance is well above 50 ohms, shown as >90 ohms in FIG. 15.

At the end of segment 85 the signal runs into a series of short lengths of line 90a-c of varying width and dielectric environments due to their locations within the circuit substrate stack up, which lines change between layers of the PCB through vias 92a-c. The varying widths of the lines, their dielectric environments, and the capacitive vias all lead to impedance discontinuities that are less than 50 ohms.

Along the way to the memory modules, the signal passes through terminating resistor 94, which is located on the top or bottom side of the circuit substrate and is connected to the buried signal paths through vias 92d-e. The resistor 94 in this case presents a resistance of 34 ohms, while the vias exhibit their typical capacitive discontinuities 92d-e in FIG. 15.

The signal traverses a short length of line 91a, at which point it reaches the location of the first memory module 87a and its associated socket 93a, where one sees a discontinuity due to via 95a an inductive discontinuity due to connector spring contact 96a, and a capacitive discontinuity at the metal pad on the memory module corresponding to the contact spring in the connector. Once on the memory module, the signal path traverses additional vias 97a and 98a, and various short lengths of line on the way to the memory ICs mounted on the module.

It is important to note that the above description covers only the signal path to and on the first of several memory modules; each succeeding module in the chain adds its own set of similar reflections, as seen in subsequent groups of similar reflections in FIG. 15. Ultimately, the signal arrives at terminating resistor 89, which may present very low impedance.

As in the case of FIG. 14, the time delay between closest and farthest memory ICs plays a role in setting the maximum operating speed of the system. In the case of the conventional CPU-to-motherboard configuration, the delay amounts to an estimated 800 ps—eight times that for the above board interposer-based system of FIGS. 12 and 14.

It is important to note that the only reason we are able to see the discontinuities in the signal path is that each discontinuity reflects energy backward to the source, away from the load. All energy reflected backward represents signal information that does not reach the load and, hence, cannot contribute to information transfer. Making up for losses in the signal path, whether from dissipative resistive effects, series wiring parasitics, or impedance discontinuities, requires the expenditure of extra power to increase the signal amplitude to make up for losses.

Figure 16:
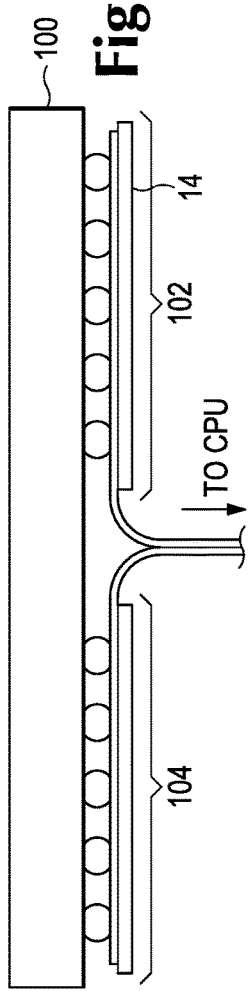
FIGS. 16-19 show embodiments of the above board interposer configured to ensure equal path lengths.

In addition to the advantages of path lengths under ¼ wavelength and fewer signal discontinuities, it is desirable that the signal paths to the components be equal for signaling and clocking coordination. FIGS. 16-19 show examples of how the above board interposer can be configured to ensure equal path lengths. FIG. 16 shows the interposer 14 connected to a peripheral circuit 100 that has two sets of connections 102 and 104. By configuring the interposer as shown, the components have equal path lengths to the CPU.

Figure 17:
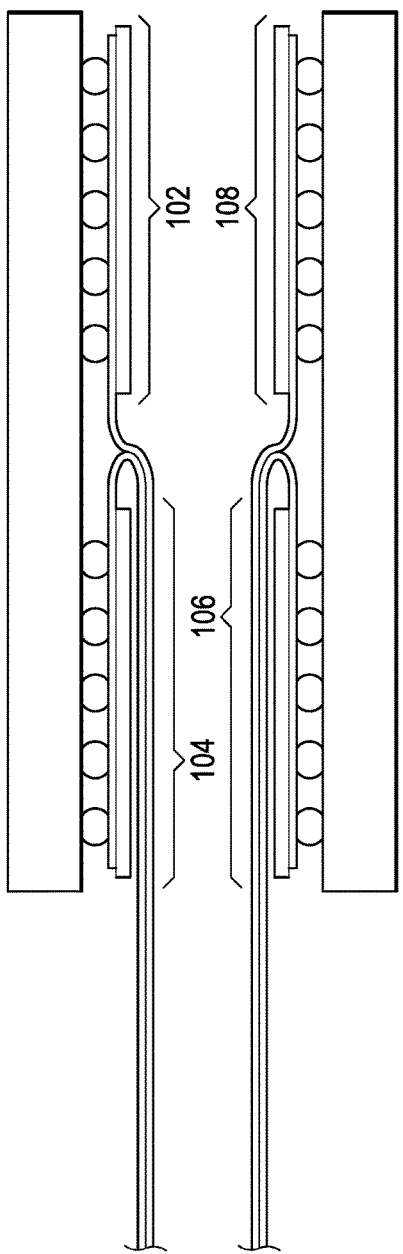
Figure 18:
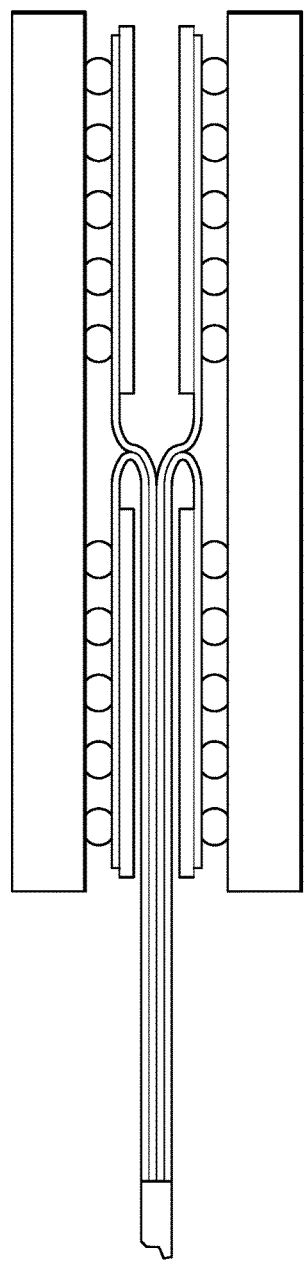
Figure 19:
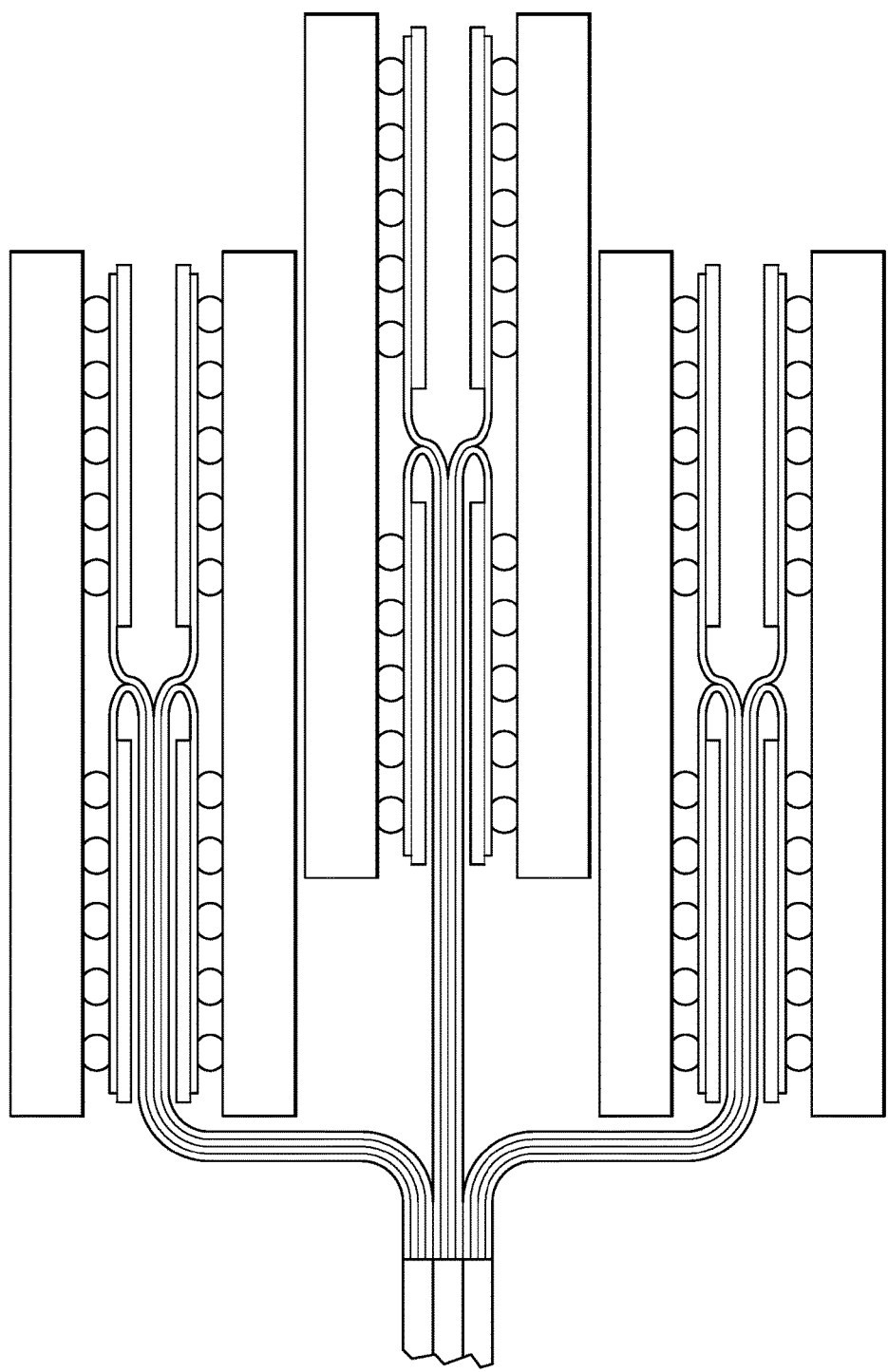

Several variations on this configuration exist. FIG. 17 shows a configuration in which the interposer is folded to provide equal path lengths to the connections 102/104 and 106/108. FIG. 18 shows a multi-layer interposer resulting from the folded configuration of FIG. 17, which is then joined. FIG. 19 shows a similar folded and joined configuration for the peripheral circuits, which are then stacked. The flexibility and capacity adaptation of these configurations is a further advantage of the flexible, above board interposer.

Figure 21:
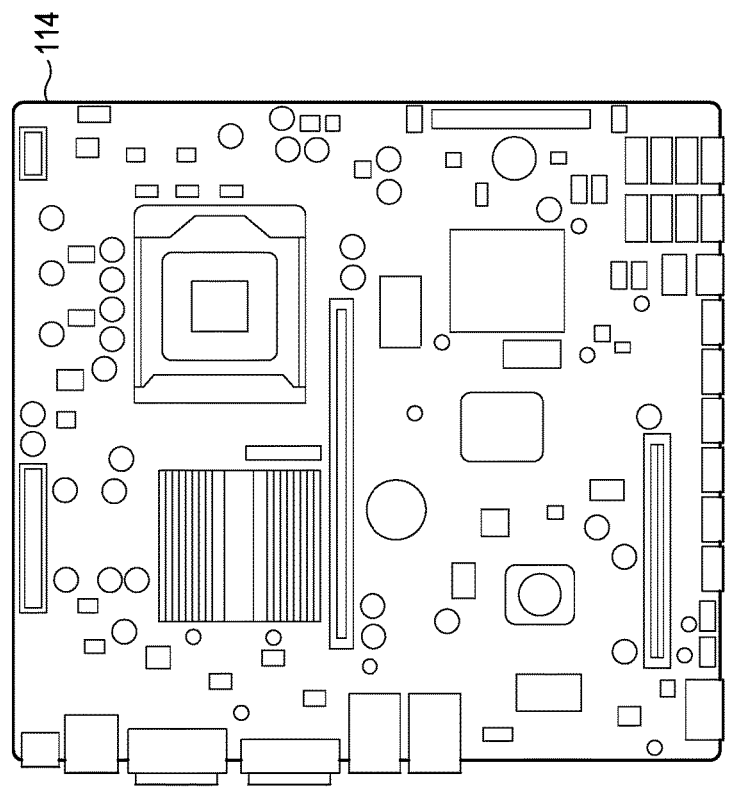
FIG. 21 shows an embodiment of a motherboard with DRAM memory wiring eliminated.
Figure 20:
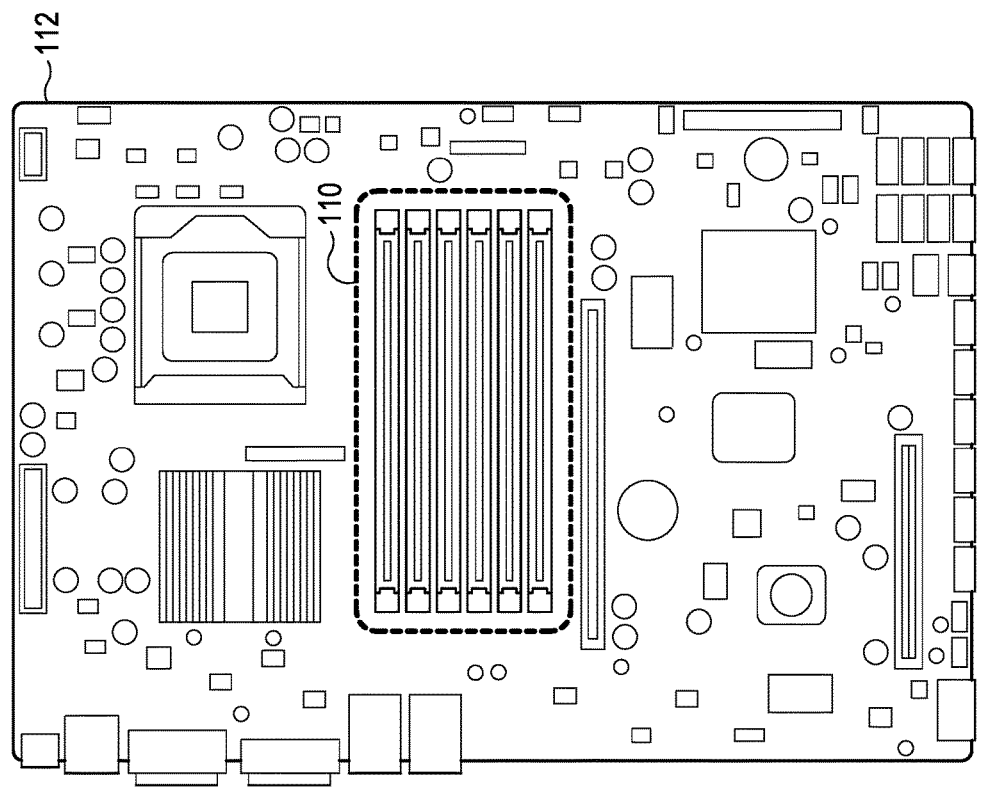
FIG. 20 shows an embodiment of a motherboard with typical DRAM memory wiring.

This discussion this far has focused on an above board interposer used on current motherboards for computing devices. However, if one were to assume the presence of the interposer at the design point of the motherboard, one could eliminate the fanout area on the motherboard such as that area shown as 110 in FIG. 20. The board 112 in this example is a single socket server. FIG. 21 shows a resulting motherboard 114 with the DRAM memory wiring and connectors eliminated. The motherboards designed with the assumption that the interposer will be used will be referred to here as 'streamlined' motherboards. Simulations have shown that this reduces the board size by 28%. The below table shows the projected board reduction sizes for different motherboard architectures based upon the number of processor sockets. Note that some architectures have ranges depending upon the layout of the board.

| Architecture | Board area reduction (%) |
|---|---|
| Single socket server | 28 |
| Double socket server | 33-40 |
| Quadruple socket server | 66 |

Figure 22:
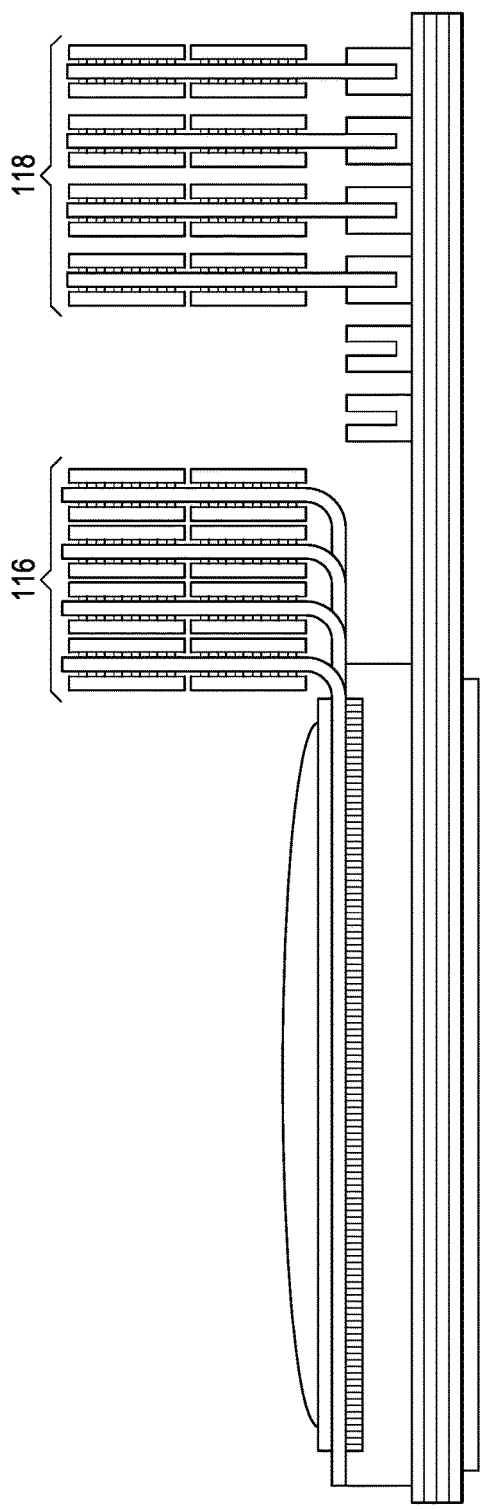
FIG. 22 shows an embodiment of an above board interposer having peripheral circuits to function as off chip DRAM cache.

In addition to assuming a retrofit application, the discussion up to this point has not addressed the possible configuration of the peripheral circuits on the interposer, except in a general sense. As mentioned above, the peripheral circuits on the interposer may consist of memory circuits such as system memory, cache, etc. FIG. 22 shows an embodiment where the peripheral circuits can function as ultra-fast, off chip, meaning off the CPU, DRAM cache.

A typical memory architecture has some predetermined number of 'lanes' for memory access. For example, an Intel® X58 motherboard has 3 memory lanes and 6 memory DIMMs. In FIG. 22, the peripheral circuits 116 on the interposer consist of 64 to 128 GB cache memory, with further access via the pass-through connections mentioned before to a 64 to 128 GB main memory 118. Obviously, many other memory capacities could be envisioned, this is merely one example.

Another advantage gained by elimination of the DIMMs in the streamlined motherboards comes from the reduction of the number of components that can fail under thermal cycling. Heat management has become a critical issue in motherboard design and operation as processing power has increased. The number of components reduces the number of possible points of failure. By eliminating the DIMM connectors, or other types of peripheral circuit connectors, the number of through-hole vias, solder joints, wiring runs, edge contacts, connectors, DIMM PCBs, resistors and capacitors removed from the board number in the tens of thousands. By employing the above board interposer, these possible points of failure vanish.

Figure 23:
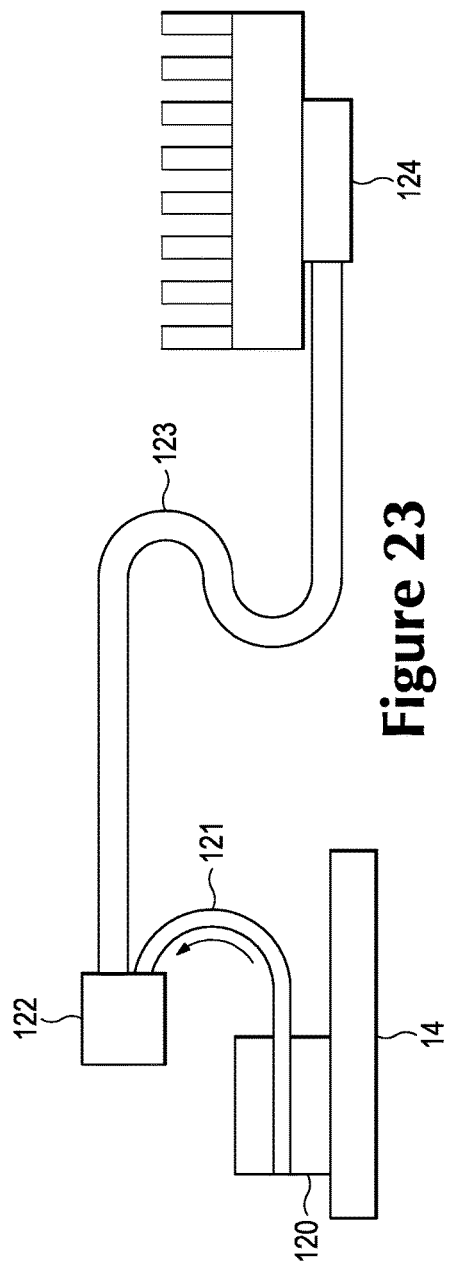
FIG. 23 shows an embodiment of an interposer having short length memory thermal paths to a CPU heat sink.

In addition to reducing the number of components that may fail during thermal cycling, the above board interposer architecture may employ short length memory thermal paths to the CPU heat sink. FIG. 23 shows an example of this. In FIG. 23, the heat from the peripheral circuit 120 on the interposer 14 is delivered via a PGS graphite sheet 121 to an existing heat sink 122. In this embodiment, the heat sink 122 is coupled to a cooler 124 via a heat pipe 123

Figure 24:
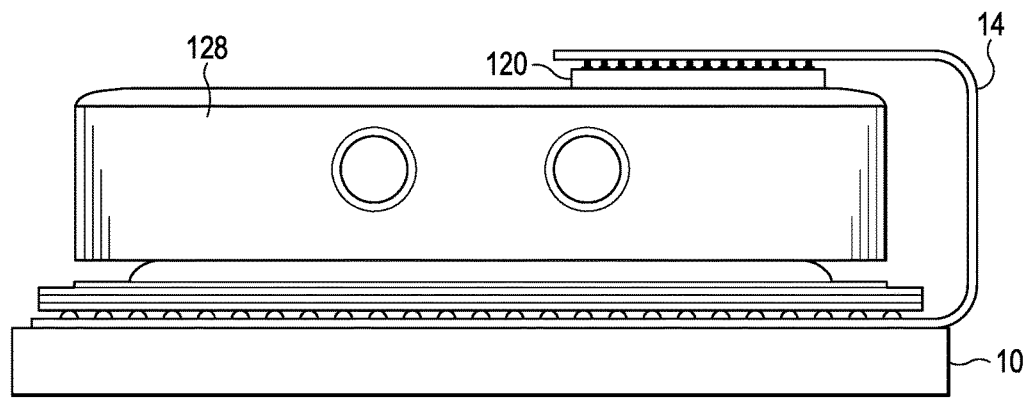
FIG. 24 shows an embodiment of the interposer having peripheral circuits in direct contact with a heat sink.

FIG. 24 shows a direct contact embodiment in which the flexibility of the interposer 14 is used to put the peripheral circuit chip 120 into direct contact with a heat sink 128. In this embodiment, the heat sink consists of a water or other liquid cooled block.

Figure 25:
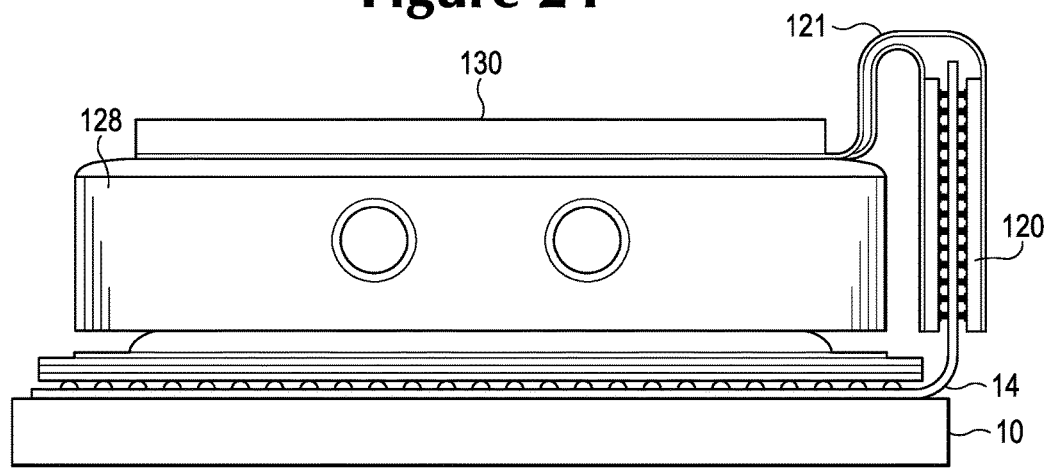
FIG. 25 shows an embodiment of an interposer having peripheral circuits connected to the heat sink with a graphite thermal sheet material or other similar heat transfer media.

FIG. 25 shows another embodiment in which the interposer 14 holds the peripheral circuits such as 120. The peripheral circuits in turn are in contact with the PGS graphite sheet 121 by the surface of the circuits away from the interposer. The PGS graphite sheet 121 then forms a thermal/mechanical interface with the heat sink 128, possibly including a copper mounting block 130. Materials other than graphite may be used in the sheet 121, including various metals, polymers, etc.

Figure 26:
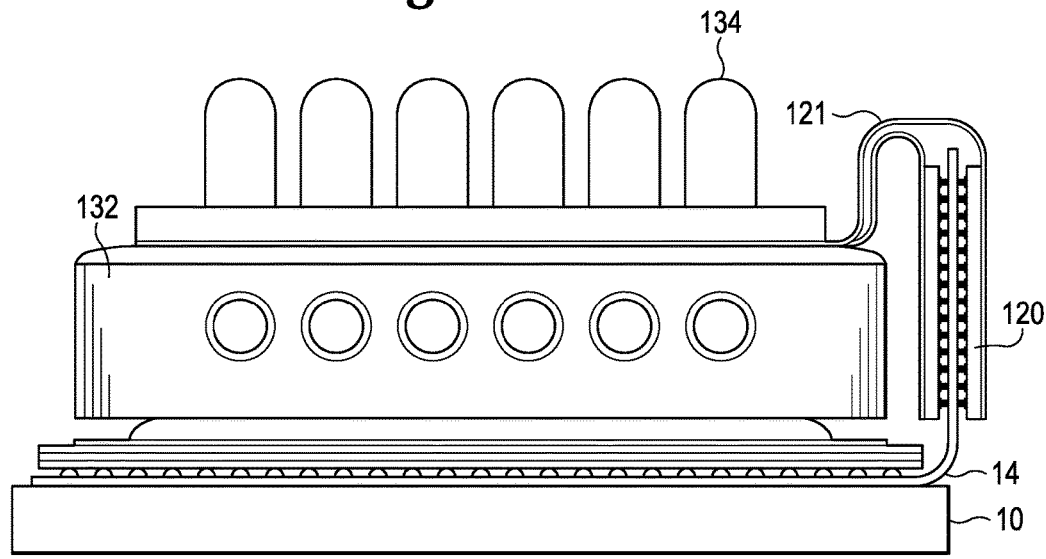
FIG. 26 shows an embodiment of an interposer having an air-cooled heat sink.

Many other forms of heat sinks exist than the water cooled block or the heat pipe to a remote cooler block discussed this far. FIG. 26 shows a similar embodiment to FIG. 25, except that this embodiment employs an air-cooled heat sink block 132 with heat pipes such as 134 thermally coupled to cooling fins 134. The flexibility of the interposer architecture allows for several different possibilities for thermal management.

Another variation mentioned but not discussed in any detail addresses the number of locations of the peripheral circuits. Returning to FIG. 2, the interposer 14 shown has an array of peripheral circuits on one side of the array of connectors for the CPU. No limitation of this type of configuration should be implied and none is intended. For example, the peripheral circuits may be on one side, two sides, three sides or all four sides of the array of connector for the CPU. Further, the array of peripheral circuits may have more than one bank of circuits. The interposer may make multiple folds when inserted into the motherboard socket, allowing for multiple banks of peripheral circuits. Similarly, multiple banks may be achieved using the connectors on the interposer shown in FIGS. 7A and 7B.

Figure 27:
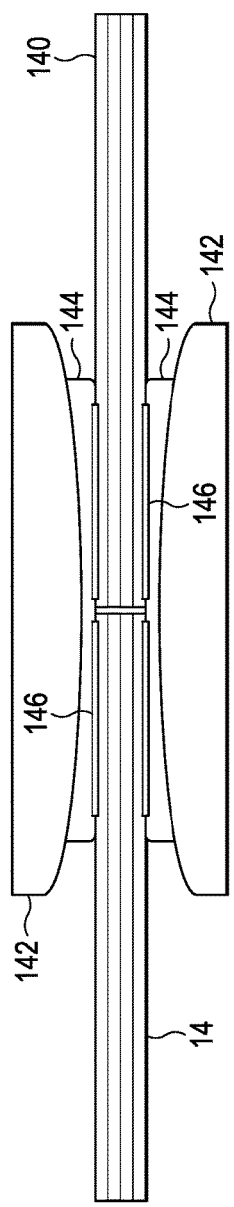
FIG. 27 shows an embodiment having an interposer coupled to another circuit.

In addition, the interposer may connect in a coplanar fashion with another circuit. FIG. 27 shows an embodiment in which the above board interposer 14 couples to another circuit 140. The connection may be made in several ways. This particular embodiment uses PCB edge connector pads 146 on the interposer 14 and the target circuit 140. These contacts are covered with a 'Zebra strip' 144. A Zebra strip normally consists of a rubber or plastic strip with carbon, or other conductive material, bands that connect between the edge connector pads 146 on each circuit. Zebra strips typically mount to the boards with an adhesive and pressure plates such as 142. This type of mounting can be very tolerant of circuit substrate thickness mismatches, mechanical misalignments, gaps, etc.

Figure 28:
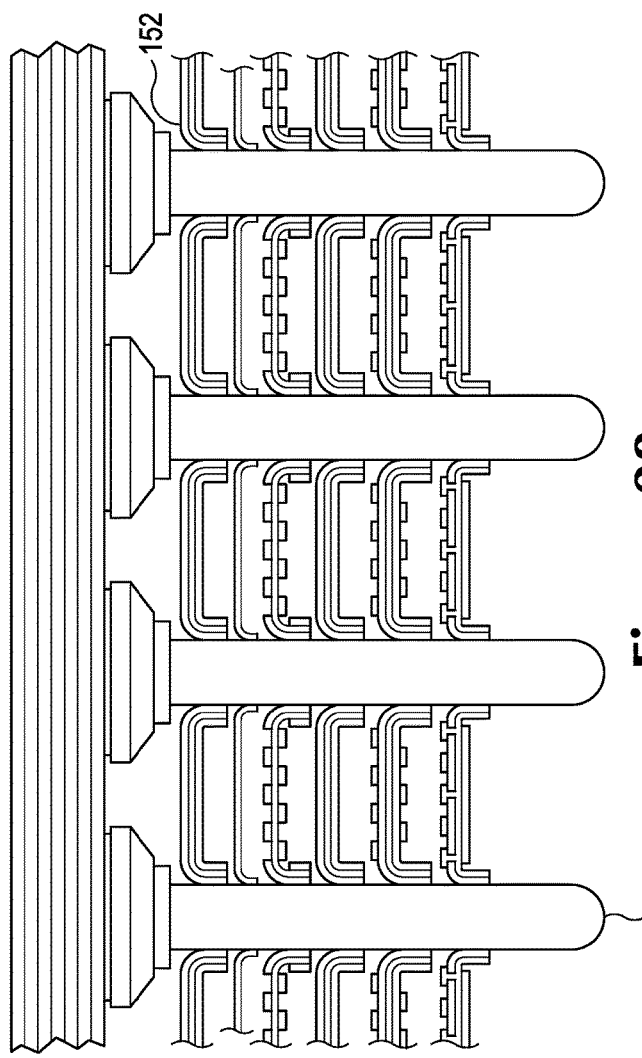
FIG. 28 shows an embodiment of an interposer mated to a CPU pin grid array.

As mentioned above, other variations include the different type of connectors used in connecting the CPU to the interposer and between the interposer and the motherboard. One such variation includes pin grid arrays. FIG. 28 shows an example of connector pins such as 150 inserting into a center opening of the copper capture pad in the socket on the motherboard. Openings in the interposer 152 allow the pins to penetrate the interposer, while having traces in the interposer to connect to the pins.

The advantages of the above board interposer are varied and numerous, as discussed above. Although there has been described to this point a particular embodiment for an above board interposer, it is not intended that such specific references be considered as limitations upon the scope of this invention except in-so-far as set forth in the following claims.

What is claimed is:

1. A computing device, comprising:
a processor having a first subset of processor interconnects and a second subset of processor interconnects;
a circuit substrate having circuit interconnects, the circuit substrate having no memory connectors but including conductive circuit paths electrically coupled to components mounted on the circuit substrate;
at least one memory device having at least one memory interconnect; and
an interposer substrate, positioned between the processor and the circuit substrate, and physically connected to the processor, the circuit substrate, and the at least one memory device, the interposer substrate comprising:
a first subset of interposer interconnects and a second subset of interposer interconnects on a first side of the interposer substrate, the first subset of interposer interconnects electrically coupled to the first subset of processor interconnects and the second subset of interposer interconnects electrically coupled to the second subset of processor interconnects;
a third subset of interposer interconnects, on a second side of the interposer substrate, electrically connected to the first subset of interposer interconnects by conductive paths through the interposer substrate and electrically coupled to the circuit interconnects; and
a fourth subset of interposer interconnects electrically coupled to the at least one memory interconnect and electrically connected to the second subset of interposer interconnects by interposer conductive traces arranged at least partially parallel to the interposer substrate such that no electrical connection exists between the interposer conductive traces and the conductive circuit paths of the circuit substrate.

2. The computing device of claim 1, wherein the at least one memory device comprises at least one set of stacked memory chips.

3. The computing device of claim 1, wherein the fourth subset of interposer interconnects are on the first side of the interposer substrate.

4. The computing device of claim 1, wherein the processor and the at least one memory device are arranged to both be in direct contact with a single heat sink.

5. The computing device of claim 1, wherein interposer substrate is soldered to the processor, the circuit substrate, and the at least one memory device.

6. The computing device of claim 1, wherein processor is a graphics processing unit.

\* \* \* \* \*